United States Patent
Lim et al.

(10) Patent No.: US 10,886,248 B2
(45) Date of Patent: Jan. 5, 2021

(54) LASER BONDING APPARATUS, METHOD OF BONDING SEMICONDUCTOR DEVICES, AND METHOD OF MANUFACTURING SEMICONDUCTOR PACKAGE

(71) Applicant: SAMSUNG ELECTRONICS CO., LTD., Suwon-si (KR)

(72) Inventors: Jun-su Lim, Anyang-si (KR); Satoshi Inada, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/244,345

(22) Filed: Jan. 10, 2019

(65) Prior Publication Data

US 2019/0214362 A1 Jul. 11, 2019

(30) Foreign Application Priority Data

Jan. 10, 2018 (KR) .................. 10-2018-0003449

(51) Int. Cl.
*H01L 23/00* (2006.01)
*H01L 21/268* (2006.01)
(Continued)

(52) U.S. Cl.
CPC ............ *H01L 24/75* (2013.01); *B23K 26/032* (2013.01); *B23K 26/034* (2013.01); *B23K 26/20* (2013.01); *H01L 21/185* (2013.01); *H01L 21/268* (2013.01); *H01L 24/83* (2013.01); *H01L 2224/0401* (2013.01); *H01L 2224/16146* (2013.01); *H01L 2224/16227* (2013.01); *H01L 2224/17181* (2013.01); *H01L 2224/32225* (2013.01); *H01L 2224/73204* (2013.01);
(Continued)

(58) Field of Classification Search
CPC ........................... H01L 21/185; H01L 21/268
See application file for complete search history.

(56) References Cited

U.S. PATENT DOCUMENTS 7,547,575 B2 6/2009 Tong et al.
9,196,600 B2 11/2015 Horng
(Continued)

FOREIGN PATENT DOCUMENTS

JP 2008-153366 A 7/2008
JP 5562571 B2 7/2014
(Continued)

OTHER PUBLICATIONS

D. Ryu, "Advanced Interconnect with Laser Assisted Bonding", Amkor Technology Korea R&D, Semicon Taiwan 2015.

*Primary Examiner* — Seahvosh Nikmanesh
(74) *Attorney, Agent, or Firm* — Lee IP Law, P.C.

(57) ABSTRACT

A laser bonding apparatus, a method of bonding a plurality of semiconductor devices arranged on a main substrate of a workpiece, to the main substrate, and a method of manufacturing a semiconductor package, the laser bonding apparatus including a chamber having a transmissive window and in which a workpiece is accommodatable; a gas supply conduit connected to the chamber and configured to supply a gas at an elevated pressure relative to a pressure outside of the chamber; and a laser generator arranged outside the chamber and configured to irradiate the workpiece accommodated in the chamber, through the transmissive window.

11 Claims, 12 Drawing Sheets

(51) Int. Cl.
*B23K 26/03* (2006.01)
*B23K 26/20* (2014.01)
*H01L 21/18* (2006.01)

(52) U.S. Cl.
CPC ............... *H01L 2924/15311* (2013.01); *H01L 2924/3511* (2013.01)

(56) References Cited

U.S. PATENT DOCUMENTS 9,440,424 B2    9/2016   Karam et al.
2009/0134046 A1*   5/2009   Breidenthal ............ B01L 3/502
                                                                                                                                                                 206/221

FOREIGN PATENT DOCUMENTS

KR          10-0643908 B1    11/2006
KR          10-0787837 B1    12/2007
KR    10-2017-0029904 A     3/2017

* cited by examiner

LASER BONDING APPARATUS, METHOD OF BONDING SEMICONDUCTOR DEVICES, AND METHOD OF MANUFACTURING SEMICONDUCTOR PACKAGE

CROSS-REFERENCE TO RELATED APPLICATION

Korean Patent Application No. 10-2018-0003449, filed on Jan. 10, 2018, in the Korean Intellectual Property Office, and entitled: "Laser Bonding Apparatus, Method of Bonding Semiconductor Devices, and Method of Manufacturing Semiconductor Package," is incorporated by reference herein in its entirety.

BACKGROUND

1. Field

Embodiments relate to a laser bonding apparatus, a method of bonding semiconductor devices, and a method of manufacturing a semiconductor package.

2. Description of the Related Art

Contact bonding may be used to bond a semiconductor device onto a substrate.

SUMMARY

The embodiments may be realized by providing a laser bonding apparatus for bonding a workpiece, the apparatus including a chamber having a transmissive window and in which the workpiece is accommodatable; a gas supply conduit connected to the chamber and configured to supply a gas at an elevated pressure relative to a pressure outside of the chamber; and a laser generator arranged outside the chamber and configured to irradiate the workpiece accommodated in the chamber, through the transmissive window.

The embodiments may be realized by providing a method of bonding a plurality of semiconductor devices arranged on a main substrate of a workpiece, to the main substrate, the method including loading the workpiece into a chamber having a transmissive window; increasing a pressure in the chamber and maintaining the increased pressure; increasing a temperature of the workpiece by irradiating a laser through the transmissive window; and lowering the pressure in the chamber.

The embodiments may be realized by providing a method of manufacturing a semiconductor package, the method including forming a workpiece having a main substrate on which a plurality of semiconductor devices are arranged; bonding the plurality of semiconductor devices to the main substrate; molding the plurality of semiconductor devices; and separating the plurality of semiconductor devices from each other, wherein bonding the plurality of semiconductor devices to the main substrate includes loading the workpiece into a chamber having a transmissive window; increasing a pressure in the chamber and maintaining the increased pressure; and increasing a temperature of the workpiece by irradiating a laser through the transmissive window.

BRIEF DESCRIPTION OF THE DRAWINGS

Features will be apparent to those of skill in the art by describing in detail exemplary embodiments with reference to the attached drawings in which.

DETAILED DESCRIPTION

According to an embodiment, there is provided a laser bonding apparatus including: a chamber having a transmissive window and capable of receiving a workpiece (e.g., in which a workpiece is accommodatable); a gas supply conduit connected to the chamber and configured to supply a gas at an elevated pressure relative to a pressure outside of the chamber; and a laser generating apparatus or laser generator arranged outside the chamber and configured to irradiate the workpiece accommodated in the chamber through the transmissive window.

Figure 1:
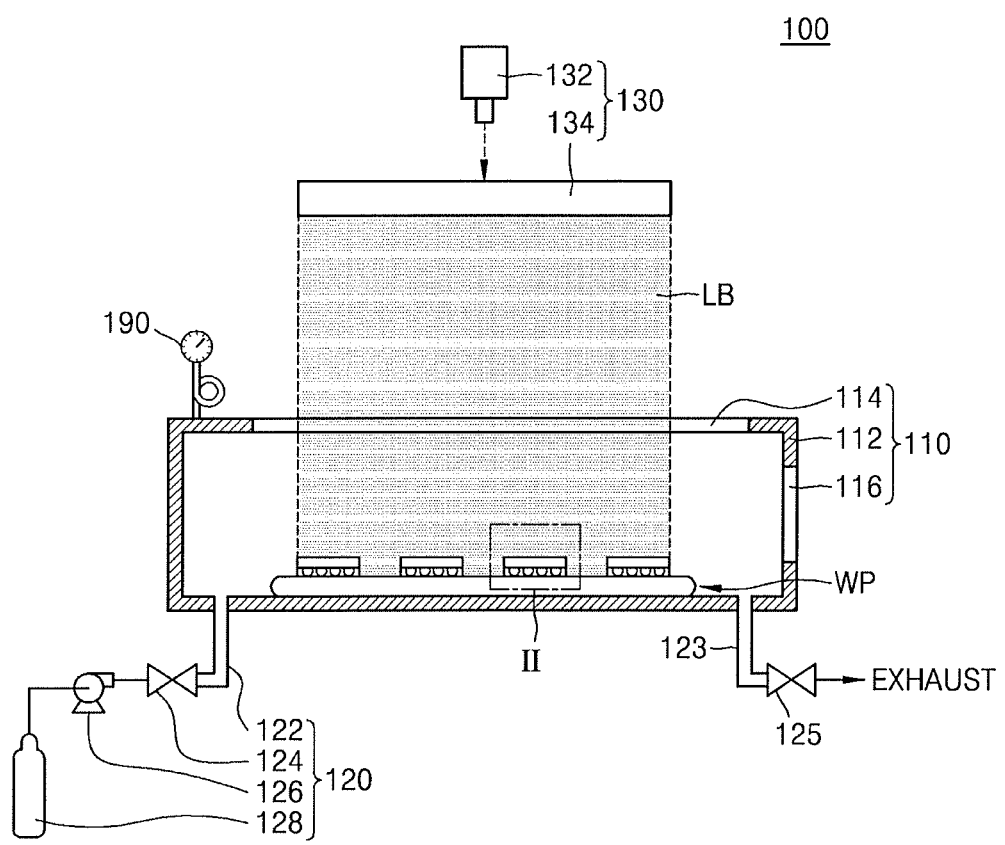
FIG. 1 illustrates a conceptual diagram of a laser bonding apparatus according to an embodiment.

FIG. 1 illustrates a conceptual diagram of a laser bonding apparatus 100 according to an embodiment.

Referring to FIG. 1, the laser bonding apparatus 100 may include, e.g., a chamber 110, a gas supply 120 connected to the chamber 110, and a laser generator 130 capable of irradiating a laser into the chamber 110.

The chamber 110 may be a suitable sealable structure that defines an internal space within which a workpiece WP may be received or accommodated. For example, the internal space of the chamber 110 may be defined by a frame 112 and a window 114.

The chamber 110 may include an opening and closing door 116 through which the workpiece WP may enter and exit. In an implementation, as illustrated in FIG. 1, the opening and closing door 116 may be be arranged at one side of the chamber 110. In an implementation, the opening and closing door 116 may be located at an upper surface or a lower surface of the chamber 110.

The frame 112 of the chamber 110 may be formed of a suitable material that is capable of withstanding a pressure in the chamber 110, e.g., a pressure of about 0.1 MPa to about 5 MPa based on, e.g., a gauge pressure. In an implementation, the frame 112 of the chamber 110 may be formed of, e.g., metal, ceramic, or polymer.

In an implementation, the frame 112 may not require high heat resistance, or high heat resistance may not be a concern when selecting a material for the frame 112. For example, the frame 112 may be formed of a suitable material that is capable of withstanding a temperature of about 200° C. The chambers used in other gas bonding methods may require a high heat resistance because a very high temperature gas is introduced into the chambers or an ultra-high temperature heat source such as a halogen lamp may be present in the chambers. However, as the chamber 110 does not involve such high-temperature heat, such a high degree of heat resistance may be unnecessary for the chamber 110.

The window 114 is light-transmissive, and may transmit, e.g., laser light emitted from the laser generator 130. Light transmittance may be defined as a capability of passing through light energy of laser light emitted from the laser generator 130 by 80% or more. In an implementation, the window 114 may be formed of a material capable of exhibiting a transmittance of about 80% or more with respect to light in a wavelength range of about 250 nm to 5 µm.

The window 114 may be formed of a suitable material that is also capable of withstanding a pressure within the chamber 110, e.g., from about 0.1 MPa to about 5 MPa, based on a gauge pressure. In an implementation, the window 114 may be formed of a metal oxide or a metalloid oxide which have transmittance, e.g., a silicon oxide or an aluminum oxide.

The chamber 110 may be connected to the gas supply 120 through which gas may be supplied to the internal space of the chamber 110. The gas supply 120 may supply an inert gas or a gas that has a very low chemical reactivity, e.g., nitrogen ($N_2$), helium (He), neon (Ne), argon (Ar), carbon dioxide ($CO_2$) or a mixture thereof, into the internal space. Hereinafter, inert gases or gases having an extremely low chemical reactivity as described above are referred to as neutral gas.

The gas supply 120 may include a reservoir 128 storing the neutral gas, a gas pump 126 supplying the neutral gas by pressurizing the neutral gas, a gas valve 124 regulating a flow of the neutral gas, and a gas supply conduit 122 providing a path through which the neutral gas is supplied into the chamber 110.

The gas pump 126 may be configured to supply the neutral gas into the chamber 110 at an elevated pressure relative to an external pressure of the chamber 110. In an implementation, the gas pump 126 may be configured to be capable of supplying a neutral gas until a pressure in the chamber 110 reaches, e.g., about 0.1 MPa to about 5 MPa based on a gauge pressure.

When a pressure inside the chamber 110 is sufficiently high, the gas valve 124 may be closed such that the supply of the neutral gas is stopped and the internal pressure of the chamber 110 is maintained. In an implementation gas valve 124 may include, e.g., a ball valve, a globe valve, a gate valve, a control valve, or the like.

The laser generator 130 may be provided outside the chamber 110. The laser generator 130 may include a laser light source 132 and an optical system 134.

The laser light source 132 may be a device capable of generating laser light based on energy supplied from the outside. The laser light source 132 may be configured to generate laser light, e.g., a solid laser such as a YAG laser, a ruby laser, a glass laser, a $YVO_4$ laser, an LD laser or a fiber laser, a liquid laser such as a color laser, or a gas laser such as a $CO_2$ laser, excimer laser (e.g., ArF laser, KrF laser, XeCl laser, XeF laser), Ar laser or He—Ne laser, or a semiconductor laser or a free electron laser.

The optical system 134 may receive laser light as a beam from the laser light source 132 and perform optical dispersion such that area heating (e.g., heating of a selected area) may be performed on a predetermined area (e.g., of the workpiece WP of a semiconductor device 20. See, e.g., FIG. 2B).

Laser light emitted from the optical system 134 may be irradiated to the workpiece WP and heat a predetermined region of the workpiece WP. In an implementation, the laser light emitted from the optical system 134 may be in a wavelength range of, e.g., about 250 nm to 5 µm.

In an implementation, a temperature at which connection terminals 23 (See FIG. 4A) of a semiconductor device 20 are reflowed may be, e.g., from about 150° C. to about 280° C. Accordingly, an output of the laser light source 132 may be adjusted considering this feature.

The laser light may be used to heat the workpiece WP so that a semiconductor device is bonded to a main substrate, as described in more detail below.

After processing on the workpiece WP is completed, the pressure in the chamber 110 may be lowered. To this end, a gas exhaust conduit 123 and an exhaust valve 125 may be provided. The exhaust valve 125 may be in a closed state while a pressure in the chamber 110 is increased and the increased pressure is maintained.

After processing on the workpiece WP is completed, the exhaust valve 125 may be opened so that neutral gases in the chamber 110 may be discharged out of the chamber 110 through the gas exhaust conduit 123.

Figure 2A:
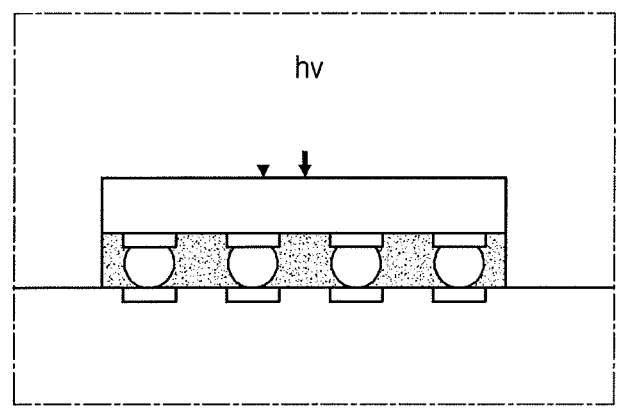
FIGS. 2A and 2B illustrate enlarged partial views of a portion II in FIG. 1, respectively, which are side views showing changes that a workpiece undergoes in response to heating by a laser.
Figure 2B:
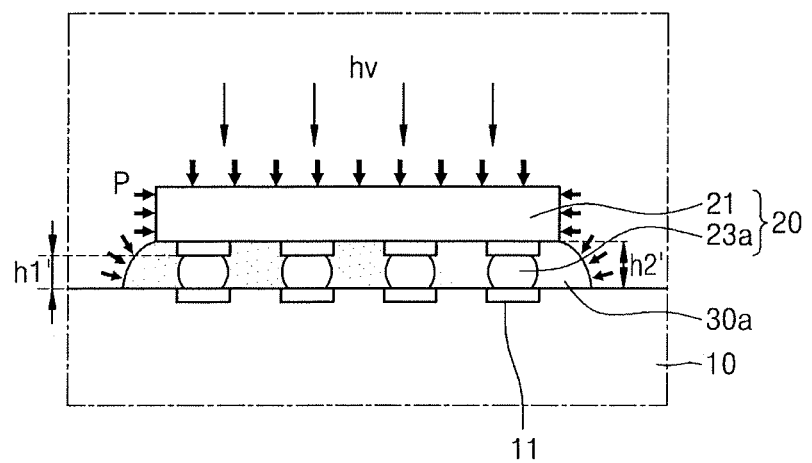

FIGS. 2A and 2B illustrate enlarged partial views of a portion II in FIG. 1, respectively, which are side views showing a change that the workpiece WP undergoes in response to heating by a laser.

Referring to FIG. 2A, the workpiece WP may include a main substrate 10 and a semiconductor device 20 arranged on the main substrate 10. In an implementation, an adhesive 30 may be further provided between the main substrate 10 and the semiconductor device 20.

The main substrate 10 may be a suitable substrate on which the semiconductor device 20 is to be bonded, and may be, e.g., a printed circuit board, a carrier substrate, or a wafer on which redistribution lines are formed.

The semiconductor device 20 may include connection terminals 23 formed on a surface of a main body 21. The main body 21 may be a semiconductor die itself or a package in which a semiconductor die is encapsulated using a molding. The molding may include a polymer material, e.g., an epoxy molding compound (EMC). When the main body 21 is a package, one semiconductor die may be included in the molding, or two or more semiconductor dies may be stacked in the molding. The two or more semiconductor dies stacked in the molding may be semiconductor dies of a same type, or may be different types of semiconductor dies.

The semiconductor device 20 may include, e.g., a volatile memory chip such as a dynamic random access memory (DRAM) or static random access memory (SRAM), a non-volatile memory chip such as phase-change random access memory (PRAM), magnetoresistive random access memory (MRAM), ferroelectric random access memory (FeRAM) or resistive random access memory (RRAM), or a logic chip such as a high bandwidth memory (HBM) DRAM semiconductor chip, a microprocessor, an analog device, or a digital signal processor.

The connection terminals 23 may be solder bumps and may be attached on one surface of the main body 21. The connection terminals 23 may be tin-based solder bumps. In an implementation, the connection terminals 23 may be formed of at least one of, e.g., tin (Sn), gold (Au), silver (Ag), platinum (Pt), copper (Cu), bismuth (Bi), palladium (Pd), chromium (Cr), calcium (Ca), nickel (Ni), germanium (Ge), zinc (Zn), manganese (Mn), cobalt (Co), tungsten (W), antimony (Sb), lead (Pd), or alloys of any of these.

In an implementation, the adhesive 30 may include, e.g., a non-conductive film (NCF), an anisotropic conductive film (ACF), an instant adhesive, an ultrasonic curing adhesive, a non-conductive paste (NCP).

A distance between an uppermost surface and a lowermost surface of the connection terminals 23 may be h1, and a distance between an uppermost surface and a lowest surface of the adhesive 30 may be h2. In an implementation, as illustrated in FIG. 2A, the lowermost surface of the connection terminals 23 may be in contact with an upper surface of the main substrate 10. In an implementation, the lowermost surface of the connection terminals 23 may be spaced apart from the upper surface of the main substrate 10.

An elevated pressure, e.g., a pressure of about 0.1 MPa to about 5 MPa, may be applied into the chamber 110, and accordingly, a uniform pressure P may be applied onto a surface of the semiconductor device 20. In an implementation, the pressure P may also be applied to an exposed surface of the adhesive 30.

When a temperature of the adhesive 30 increases due to a laser applied thereto, as a viscosity of the adhesive 30 decreases, and flowability may be generated or increased in the adhesive 30. A temperature of the connection terminals 23 may also be increased, and accordingly, the connection terminals 23 may also be gradually reflowed. In an implementation, the connection terminals 23 may be reflowed at, e.g., about 150° C. to about 280° C., and the adhesive 30 may have flowability at a lower temperature than the above-described temperatures.

Referring to FIG. 2B, as the connection terminals 23 are reflowed and the flowability of the adhesive 30 is increased, the distance h2 between the uppermost surface and the lowermost surface of the adhesive 30 may be reduced to h2'. In an implementation, the distance h1 between the uppermost surface and the lowermost surface of the connection terminals 23 may also be reduced to h1'.

Warping could occur as the semiconductor device 20 undergoes a temperature change. As the semiconductor device 20 of FIG. 2B receives an elevated pressure P from the outside, warping may be reduced.

In addition, applying a force to the semiconductor device 20 to reduce warpage is a non-contact type, and any drawbacks caused by contact bonding (e.g., misalignment of a semiconductor device due to contact with a solid block used in pressurizing, tailing and particles caused by an adhesive film, or defects caused by wrinkles of a release film) may be prevented.

For example, according to other contact bonding method, a plurality of semiconductor devices 20 arranged on the main substrate 10 may be bonded to each other by heating the semiconductor devices 20 one by one. However, when using the laser bonding apparatus according to an embodiment, temperatures of the plurality of semiconductor devices 20 may be simultaneously increased to bond the plurality of semiconductor devices 20, and thus, a units per hour (UPH), which is the number of products that may be manufactured per unit time, may be greatly improved.

In addition, as the laser generator 130 is located outside the chamber 110, there is no possibility of contamination due to a fume generated by the reflow of the solder bumps and/or melting of the adhesive. If fume contamination is severe, downtime may be prolonged because the chamber 110 needs to be cleaned frequently.

In addition, a laser may be used to heat the semiconductor device 20, and a larger number of semiconductor devices may be processed in a shorter period of time than when using other types of non-contact type bonding methods, e.g., where a halogen lamp or a high temperature gas is used.

Figure 3:
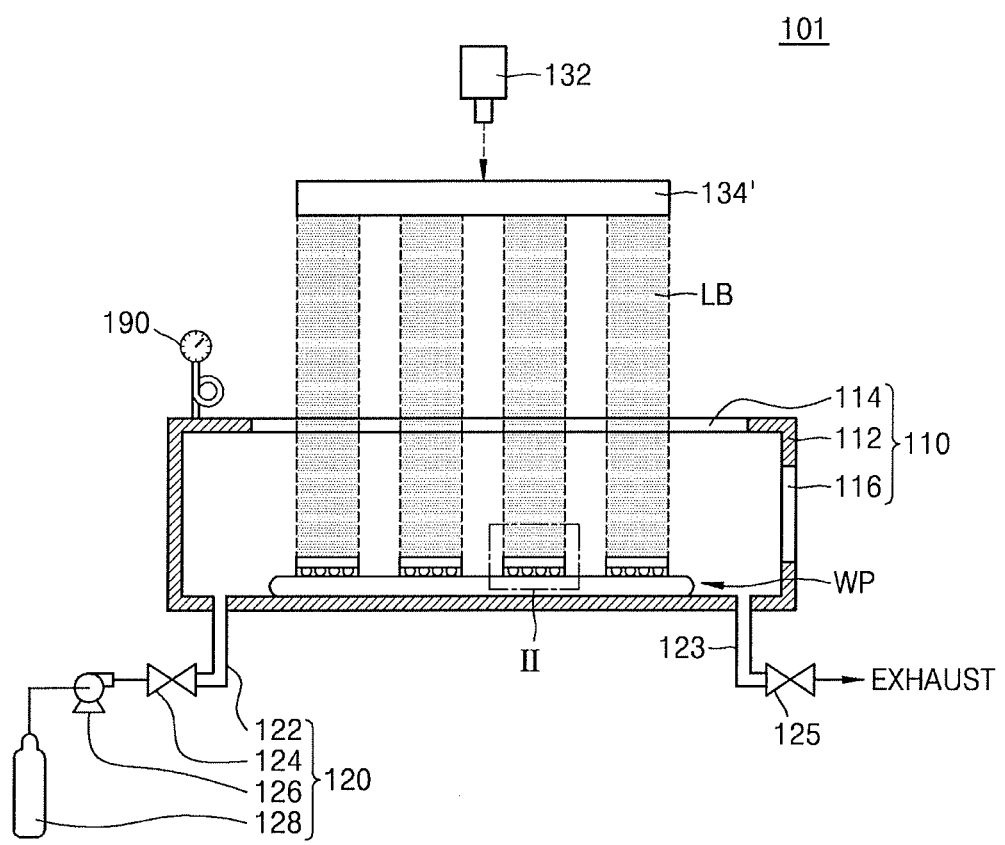
FIG. 3 illustrates a conceptual diagram of a laser bonding apparatus according to another embodiment.

FIG. 3 illustrates a side view of a laser bonding apparatus 101 according to another embodiment. The laser bonding apparatus 101 of FIG. 3 differs from the laser bonding apparatus 100 of FIG. 1 in terms of laser light emitted by an optical system 134'. Thus, the description below will focus on this difference.

Referring to FIG. 3, the optical system 134' may irradiate a laser beam LB corresponding to each semiconductor device on a workpiece WP. In an implementation, the laser beam LB may sequentially irradiate each semiconductor device at a temporally extremely short time interval. In an implementation, the laser beam LB may irradiate at least two semiconductor devices simultaneously. In an implementation, the laser beam LB may irradiate all semiconductor devices simultaneously.

Each laser beam LB may perform area heating on at least a portion of a corresponding semiconductor device. In an implementation, each laser beam LB may be used in area heating to cover an entire area of a corresponding semiconductor device.

Using the apparatus illustrated in FIG. 3, by irradiating the laser beam LB only to each semiconductor device, a heated portion of the main substrate 10 may be reduced relatively.

FIGS. 4A through 4D illustrate side views of stages in a method of manufacturing a semiconductor package, according to an embodiment.

Figure 4A:
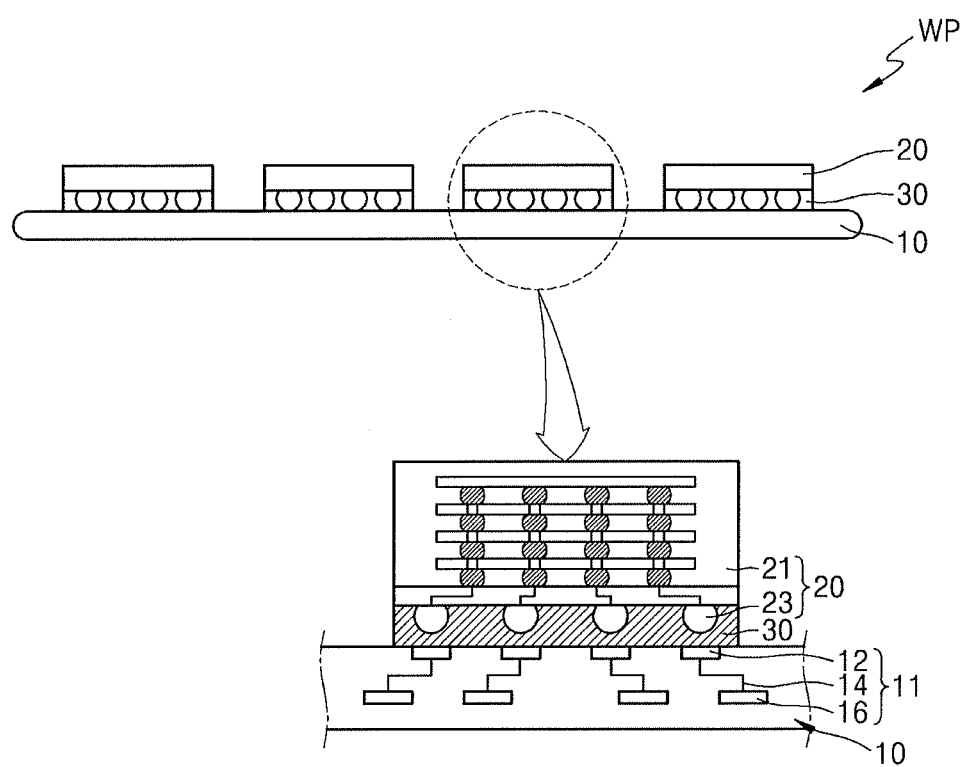
FIGS. 4A through 4D illustrate side views of stages in a method of manufacturing a semiconductor package, according to an embodiment.

Referring to FIG. 4A, a plurality of semiconductor devices 20 may be arranged on a main substrate 10. The main substrate 10 may be, e.g., a printed circuit board, a carrier substrate, a wafer or the like. In an implementation, the main substrate 10 may be a wafer having a redistribution layer including fan-out wiring. Hereinafter, description will focus on an embodiment where the main substrate 10 is a wafer having a redistribution layer.

A redistribution layer 11 may be provided on an upper surface of the main substrate 10. The redistribution layer 11 may include an upper terminal 12, a lower terminal 16, and a wiring 14 electrically connecting the upper terminal 12 to the lower terminal 16. The upper terminal 12 may be exposed on the upper surface of the main substrate 10. Referring to FIG. 4A, in an implementation, the lower terminal 16 may be located inside the main substrate 10, e.g., below the redistribution layer 11. In an implementation, the lower terminal 16 may be exposed on or at a lower surface of the main substrate 10.

The upper terminal 12 may be disposed at a position corresponding to (e.g., aligned with or underlying) the connection terminals 23 of the semiconductor device 20.

The semiconductor device 20 may be attached to the main substrate 10 via the adhesive 30. The adhesive 30 has been described in detail with reference to FIG. 2A, and thus, a repeated detailed description thereof may be omitted.

The connection terminals 23 of the semiconductor device 20 may be embedded in the adhesive 30 and spaced apart from the upper surface of the main substrate 10 by a predetermined distance. In an implementation (e.g., in the embodiment shown in FIG. 2A), the connection terminals 23 may be in contact with the upper surface of the main substrate 10.

Hereinafter, a product to which the semiconductor device 20 is attached on the main substrate 10 is referred to as a workpiece WP.

Figure 4B:
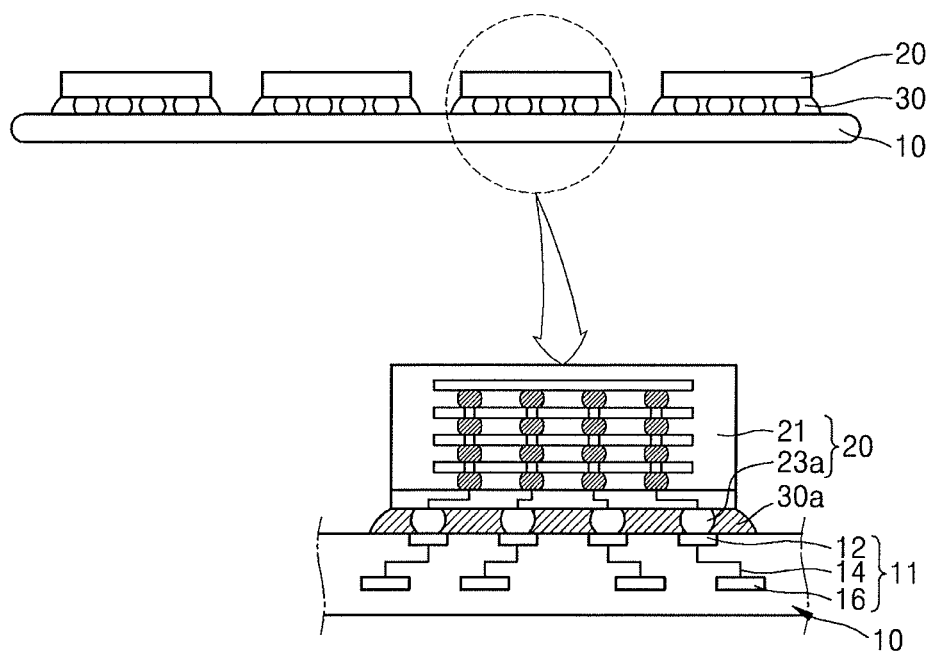

Referring to FIG. 4B, the semiconductor device 20 may be bonded to the main substrate 10. Herein, the term 'bonding' refers to a process in which the connection terminals 23 are not only in contact with the main substrate 10 but are also connected at a sufficiently low resistance so as to constitute one electrically integrated practical circuit. For example, a process in which the connection terminals 23 are reflowed to have sufficient area contact with the upper terminal 12 may be referred to as bonding.

Figure 5:
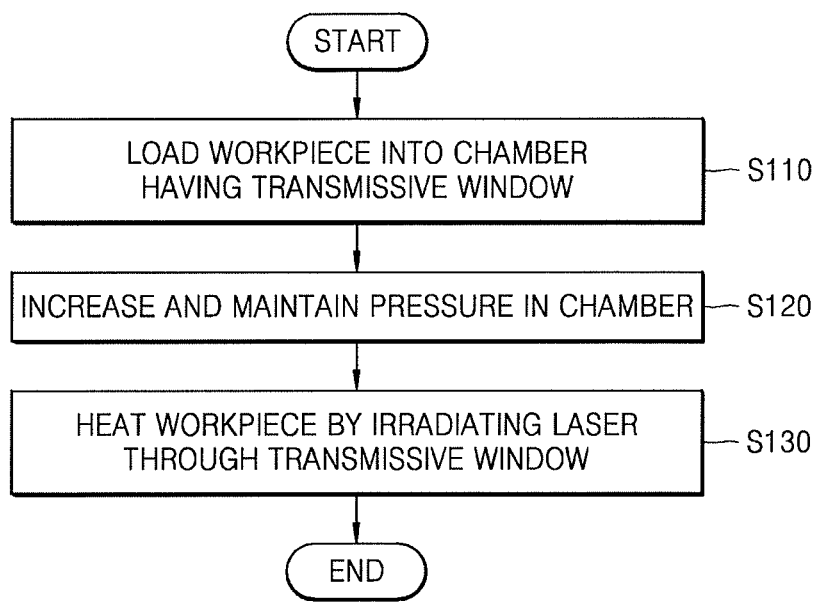
FIG. 5 illustrates a flowchart of a method of bonding a semiconductor device to a main substrate.

In order to bond the semiconductor device 20 to the main substrate 10, the semiconductor device 20 may be loaded into the laser bonding device 100, as shown in FIG. 1. FIG. 5 illustrates a flowchart of a method of bonding the semiconductor device 20 to the main substrate 10.

Referring to FIGS. 1, 4B, and 5 together, after opening the opening and closing door 116, the workpiece WP may be loaded into the internal space of the chamber 110 and then the opening and closing door 116 may be closed (S110).

Next, by supplying a neutral gas into the chamber 110, a pressure in the chamber 110 may be increased (S120). The neutral gas may be pumped from the reservoir 128 to the chamber 110 through the gas supply conduit 122 by using the gas pump 126. The supply of the neutral gas may be continued until the pressure inside the chamber 110 reaches, e.g., about 0.1 MPa to about 5 MPa based on a gauge pressure.

Here, the "gauge pressure" is a pressure readable from a gauge 190 attached to the chamber 110, and may indicate a pressure difference from an external pressure outside the chamber 110. For example, when an atmospheric pressure outside the chamber 110 is 0.1 MPa and a gauge pressure is 0.1 MPa, an absolute pressure inside the chamber 110 is 0.2 MPa.

When a pressure inside the chamber 110 is sufficiently increased, e.g., to from about 0.1 MPa to about 5 MPa, the gas valve 124 may be closed to seal the chamber 110.

Then, the workpiece WP may be heated by irradiating the semiconductor device 20 with the laser through the window 114 which is transmissive (S130). In an implementation, the laser generator 130 may be configured to simultaneously irradiate a plurality of the semiconductor devices 20 with a laser. In an implementation, the laser generator 130 may be configured to simultaneously irradiate two or more semiconductor devices 20 with a laser. In an implementation, the laser generator 130 may be configured to sequentially irradiate a plurality of the semiconductor devices 20 with a laser.

Figure 6A:
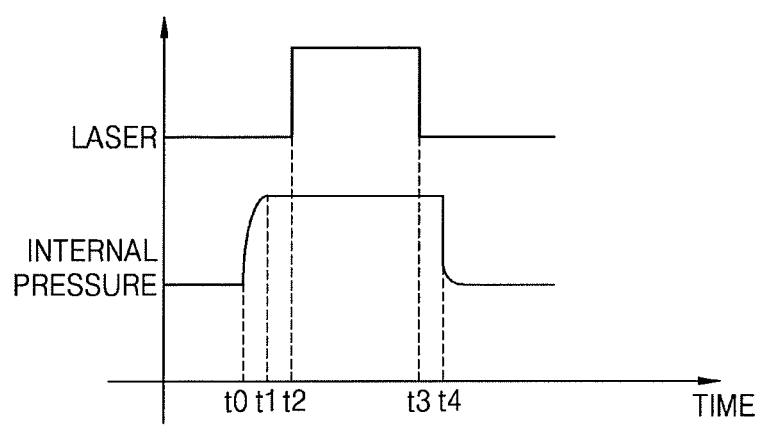
FIGS. 6A and 6B illustrate graphs showing a temporal relationship between an internal pressure of a chamber and laser irradiation.
Figure 6B:
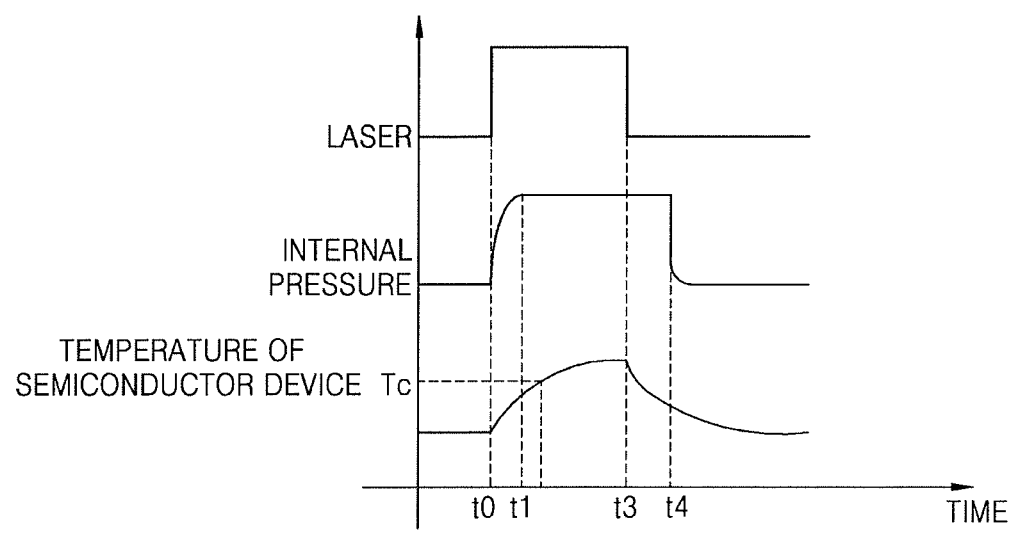

FIGS. 6A and 6B illustrate graphs showing a temporal relationship between an internal pressure of the chamber 110 and laser irradiation.

Referring to FIG. 6A, first, there may be a time difference between a time t0 at which the internal pressure of the chamber 110 starts to increase and a time t1 at which the increase in the pressure is completed. In the present embodiment, a time t2 at which laser irradiation starts may be after the time t1 when the increase in the pressure inside the chamber 110 is completed. Conditions for heating the semiconductor devices 20 are achieved by completing the increase in the pressure inside the chamber 110, and then, by heating the semiconductor devices 20, bonding may be performed while sufficiently preventing warpage of the semiconductor devices 20.

When the bonding is completed, irradiation of the laser may be stopped (at time t3), and the internal pressure of the chamber 110 may be lowered (at time t4). Referring to FIG. 1 again, the exhaust valve 125 may be opened to reduce the internal pressure of the chamber 110.

Referring to FIG. 6B, in an implementation, even though the pressure inside the chamber 110 is yet not fully raised, irradiation of laser may be started. For example, a time at which an increase in the internal pressure of the chamber 110 is started may coincide with a time point at which laser starts to be irradiated (at time t0). In this case, a temperature of the semiconductor device 20 may rise in an upward convex shape.

The internal pressure of the chamber 110 may only be sufficiently increased at the time t1, shortly after the irradiation of laser has started. As the main purpose of increasing the internal pressure of the chamber 110 is to prevent warping of the semiconductor devices 20, if warpage of the semiconductor device 20 starts to occur at a predetermined temperature (e.g., Tc) or higher, it may be sufficient when internal pressure conditions of the chamber 110 are achieved until an arbitrary time (e.g., t1) before a temperature of the semiconductor devices 20 reaches the temperature Tc. For example, even if the increase in the internal pressure of the chamber 110 starts simultaneously with laser irradiation (time t0), when an increase in the internal pressure of the chamber 110 occurs sufficiently quickly to be completed before the semiconductor devices 20 are heated up to a temperature at which warpage becomes problematic (e.g., at the time t1), bonding without warpage may be achieved.

In this case, the internal pressure of the chamber 110 may be raised with the laser irradiation, and a bonding time may be reduced by a period between the time t2 of the laser irradiation and the time t0 at which the pressure in the chamber 110 starts to increase.

In the embodiment of FIG. 6B, when the bonding is completed at the time t3, the irradiation of the laser may be stopped, and the temperature of the semiconductor device 20 may start to decrease from the time t3. In addition, the internal pressure of the chamber 110 may be reduced at any time (t4 in FIG. 6B) when the bonding is completed or after the time t3. Referring back to FIG. 1, the exhaust valve 125 may be opened to reduce the internal pressure of the chamber 110.

Connection terminals 23a may be electrically connected to the upper terminal 12 of the main substrate 10 by bonding, and the adhesive 30a may also have an inclined side surface after being melted and re-cured. The adhesive 30a may have a shape that widens downward. As described with reference to FIG. 2B, a distance between an uppermost surface and a lowermost surface of the adhesive 30a after bonding may be reduced compared to before bonding.

The bonded workpiece WP may be taken out of the chamber 110 after opening the opening and closing door 116.

Figure 4C:
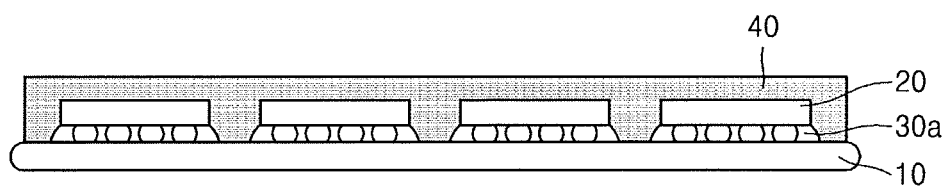

Referring to FIG. 4C, a molding resin 40 may be molded to cover a plurality of the semiconductor devices 20 on the main substrate 10. The molding may be performed, e.g., by using the molding resin 40 such as an epoxy molding compound.

The molding resin 40 may be a polymer material layer having a fluidity that may be increased by a temperature rise. The molding resin 40 may be a material layer including an epoxy resin as a matrix component and a component capable of crosslinking with the epoxy resin, such as a phenolic resin. The molding resin 40 may further include an elastomer component to impart elasticity to the material layer.

In an implementation, the epoxy resin include, e.g., a triphenylmethane resin, a cresol novolac resin, a biphenyl resin, a bisphenol A resin, a modified bisphenol A resin, bisphenol F resin, a modified bisphenol F resin, a dicyclopentadiene resin, a phenol novolac resin, or a phenoxy resins.

In an implementation, the component capable of cross-linking with the epoxy resin may include, e.g., a phenol novolac resin, a phenol aralkyl resin, a biphenyl aralkyl resin, a dicyclopentadiene type phenol resin, a cresol novolac resin, or a resol resin. These resins may be used alone or two or more thereof may be used in combination.

In an implementation, the elastomer component may include, e.g., an isoprene rubber, an ethylene-vinyl acetate copolymer, a styrene-butadiene rubber, a butadiene rubber, a styrene acrylate copolymer, an acrylic copolymer (e.g., a polyacrylate ester), an acrylonitrile rubber, or the like, and these elastomer components may be used alone or two or more thereof may be used in combination.

The molding resin 40 may be deformable by a force applied from the outside while maintaining elasticity, and may exhibit flexibility.

There may be a boundary or an interface between the molding resin 40 and the adhesive 30a.

Figure 4D:
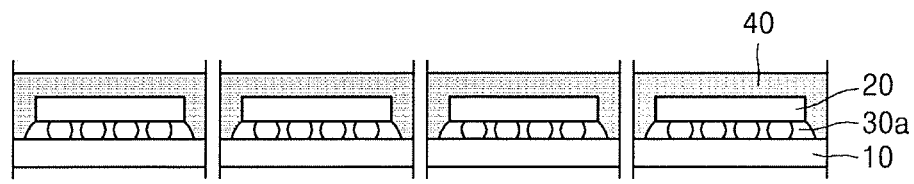

Referring to FIG. 4D, dicing may be performed to divide the semiconductor devices 20. In an implementation, before performing the dicing, thinning or grinding may be performed on a lower surface of the main substrate 10. For example, as described with reference to FIG. 4A, when the lower terminal 16 of the redistribution layer 11 is not exposed, thinning may be performed on the lower surface of the main substrate 10 so that the lower terminal 16 of the redistribution layer 11 is exposed. After the thinning, a conductive layer such as a under bump metal (UBM) may be further formed on the lower surface of the main substrate 10.

In an implementation, an operation of forming a solder bump on the lower terminal 16 or the UBM on the lower surface of the main substrate 10 may be further included.

In an implementation, the dicing may be performed by, e.g., blade sawing, laser sawing, plasma sawing or the like.

FIGS. 7A through 7E illustrate side views of stages in a method of manufacturing a semiconductor package, according to an embodiment.

Figure 7A:
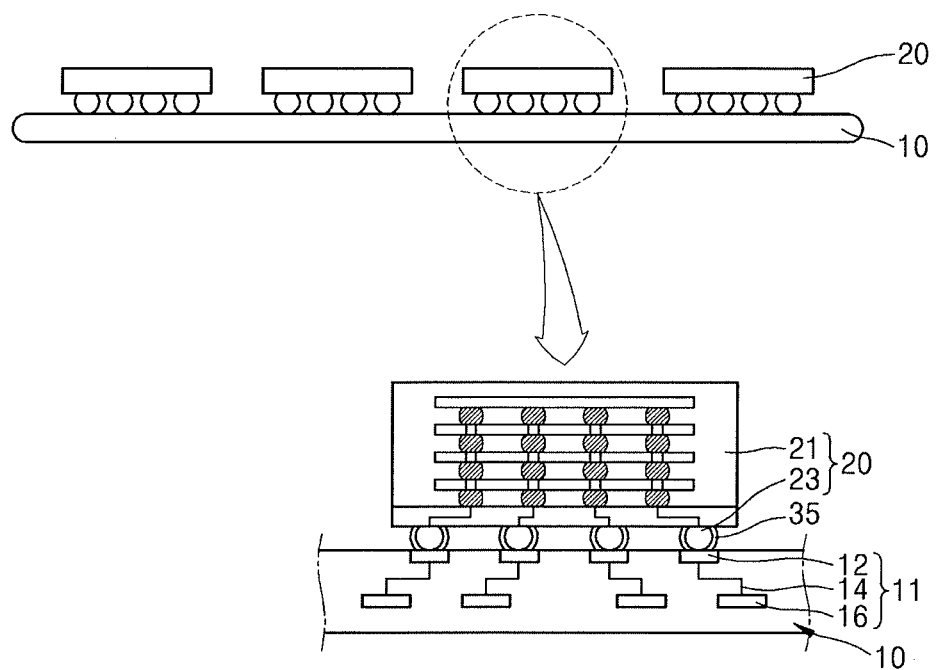
FIGS. 7A through 7E illustrate side views of stages in a method of manufacturing a semiconductor package, according to an embodiment.

Referring to FIG. 7A, a plurality of semiconductor devices 20 may be arranged on the main substrate 10. A work piece WP of FIG. 7A is identical to the workpiece WP of FIG. 4A except that the adhesive 30 is not used. Thus, description below will focus on differences between the embodiment of FIG. 4A and the embodiment of FIG. 7A.

A surface of the connection terminals 23 of the semiconductor devices 20 may be coated with a flux 35. The flux 35 may be provided on the surface of the connection terminals 23 before the semiconductor devices 20 are placed and arranged on the main substrate 10. The flux 35 may be formed by, e.g., dipping the connection terminals 23.

The flux 35 may be a flux prepared by mixing components, e.g., a solvent, rosin, a thixotropic agent, and an activator. In an implementation, an amount of the solvent to the total flux of 100 mass % may be, e.g., about 30 mass % to about 60 mass %; an amount of the thixotropic agent may be, e.g., about 1 mass % to about 10 mass %; and/or an amount of the activator may be about 0.1 mass % to about 10 mass %.

Examples of the solvent that may be used for preparation of the flux may include organic solvents having a boiling point of 180° C. or higher, such as diethylene glycol monohexyl ether, diethylene glycol monobutyl ether, diethylene glycol monobutyl ether acetate, tetraethylene glycol, 2-ethyl-1,3-hexanediol, α-terpineol, or the like.

The rosin may include, e.g., gum rosin, hydrogenated rosin, polymerized rosin, or ester rosin.

The thixotropic agent may include, e.g., hardened castor oil, fatty acid amide, natural fat, synthetic fat, N,N'-ethylene bis-12-hydroxystearyl amide, 12-hydroxystearic acid, 1,2,3,4-dibenzylidene-D-sorbitol, or derivatives thereof.

The activator may include, e.g., a hydrohalogenic acid amine salt. In an implementation, the activator may include, e.g., a hydrochloride or hydrobromide of an amine such as triethanolamine, diphenylguanidine, ethanolamine, butylamine, aminopropanol, polyoxyethylene oleylamine, polyoxyethylene laurylamine, polyoxyethylene stearylamine, diethylamine, triethylamine, methoxypropylamine, dimethylaminopropylamine, dibutylaminopropylamine, ethylhexylamine, ethoxypropylamine, ethylhexyloxypropylamine, bispropylamine, isopropylamine, diisopropylamine, piperidine, 2,6-dimethylpiperidine, aniline, methylamine, ethylamine, 3-amino-1-propene, dimethylhexylamine, or cyclohexylamine.

Figure 7B:
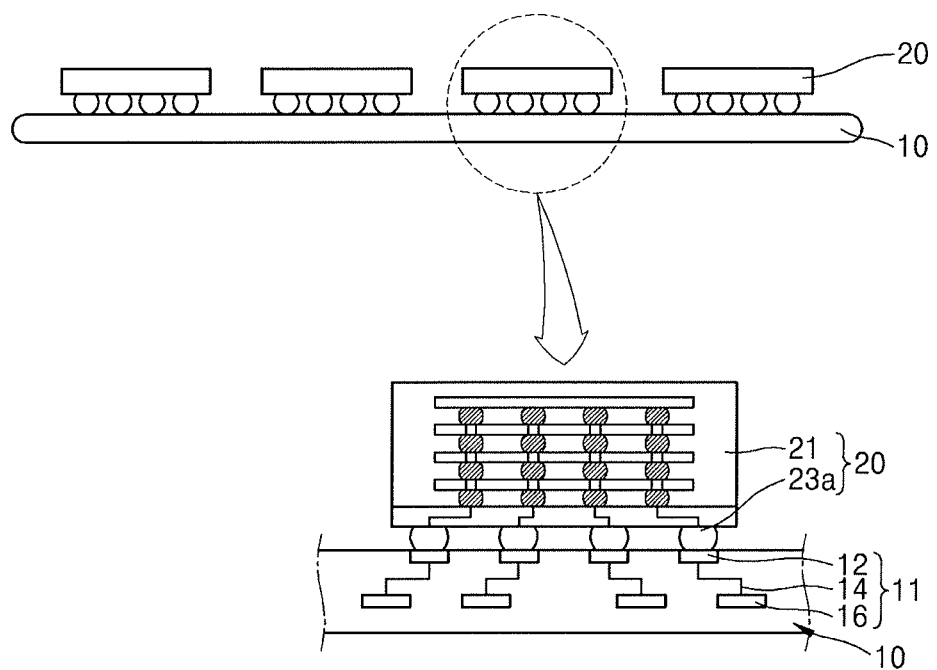

Referring to FIG. 7B, the semiconductor device 20 may be bonded to the main substrate 10. As this bonding has been described with reference to FIGS. 1, 4B, and 5, further repeated description may be omitted. The difference here is that while space between the semiconductor devices 20 and the main substrate 10 may be filled by the adhesive 30a in the embodiment of FIG. 4B, as there is no adhesive in the embodiment of FIG. 7B, space between the connection terminals 23a between the semiconductor devices 20 and the main substrate 10 may be empty (e.g., before and during bonding).

Figure 7C:
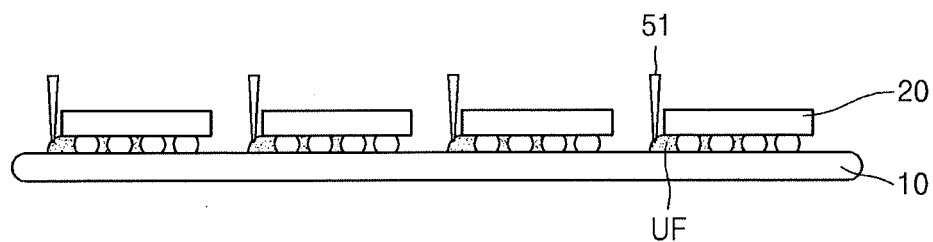

Referring to FIG. 7C, an underfill material UF may be provided to fill the space between the connection terminals 23a between the semiconductor devices 20 and the main substrate 10. The underfill material UF may include, e.g., an epoxy underfill material. In an implementation, the underfill material UF may further include reinforcing particles. For example, the underfill material UF may include filler particles formed of silicon or glass as reinforcing particles.

In an implementation, injection of the underfill material UF may be performed by using a capillary phenomenon, as illustrated in FIG. 7C. In an implementation, the underfill material UF may also be provided using another method. In an implementation, the underfill material UF may be provided at one side of the semiconductor device 20 through a nozzle 51.

Figure 7D:
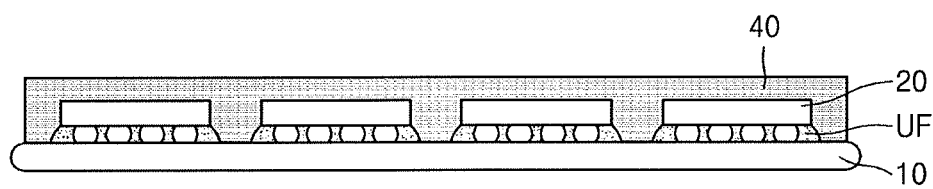

Referring to FIG. 7D, the molding resin 40 may be molded to cover the plurality of semiconductor devices 20 on the main substrate 10. The molding may be performed by using the molding resin 40 such as an epoxy molding compound. The operation of FIG. 7D may be substantially identical to the operation of FIG. 4C, and a repeated description may be omitted here.

Figure 7E:
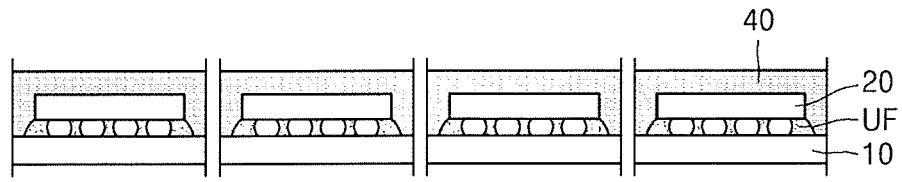

Referring to FIG. 7E, dicing may be performed to divide the semiconductor devices 20. As the operation of FIG. 7E is substantially identical to the operation of FIG. 4D, repeated description will be omitted here.

According to the bonding apparatus and the bonding method of an embodiment, problems or issues caused due to contact bonding may be resolved, and as the bonding apparatus and the bonding method according to an embodiment are suitable for mass production, semiconductor products may be manufactured at lower costs.

Figure 8:
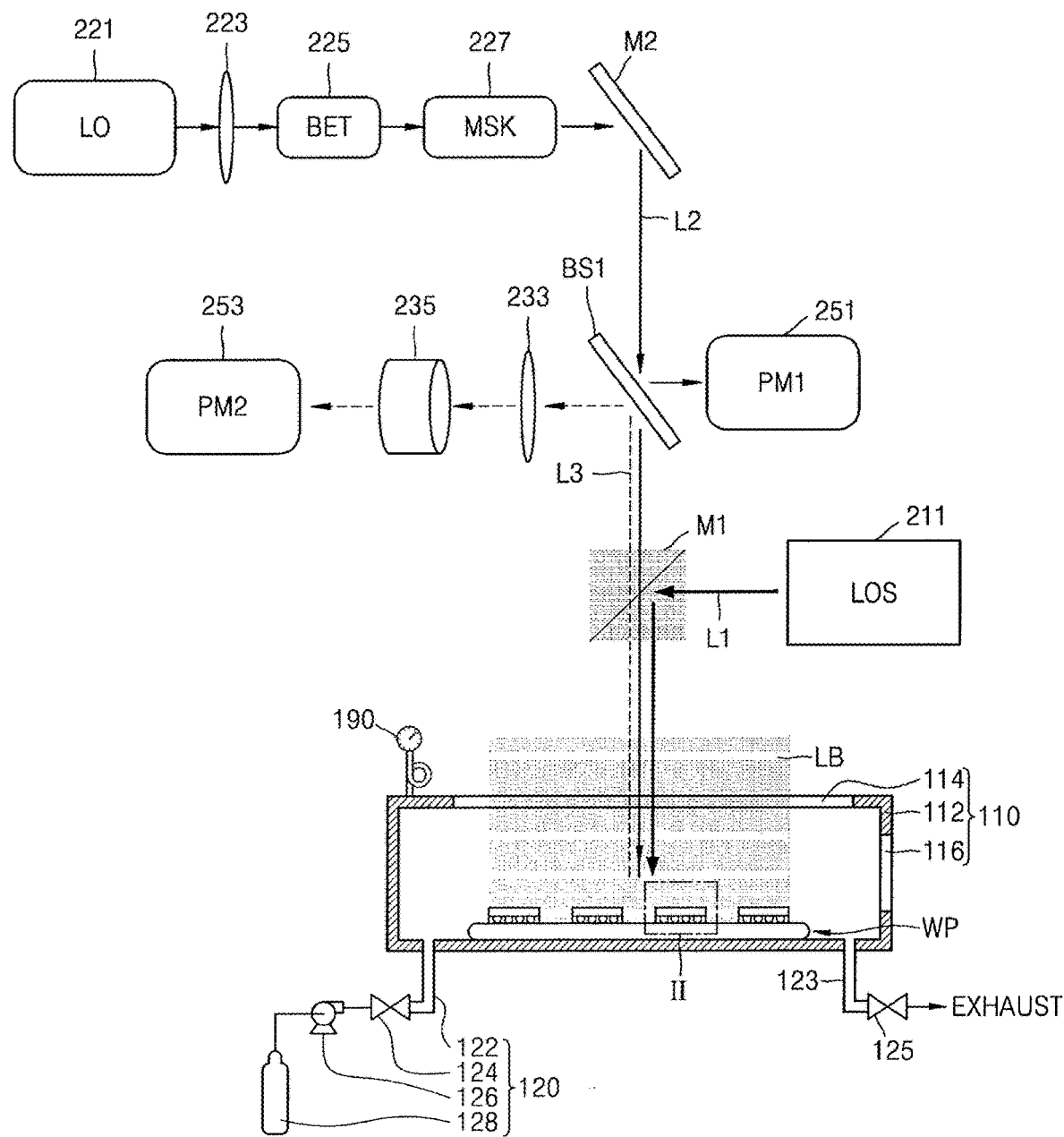
FIG. 8 illustrates a conceptual block diagram showing a laser generator according to an embodiment.

FIG. 8 illustrates a conceptual block diagram showing the laser generator 130 according to an embodiment.

Referring to FIG. 8, the laser generator 130 may include a laser oscillation structure (LOS) 211, a laser oscillator (LO) 221, first and second band-stop filters 223 and 233, a beam expansion telescope (BET) 225, a beam mask (MSK) 227, a first focusing lens 235, first and second power meters PM1 and PM2 251 and 253, first and second reflective mirrors M1 and M2, and a chamber 110.

As will be described below, a first laser beam L1 irradiated to the workpiece WP may be irradiated to the workpiece WP through the window 114. The laser oscillation structure (LOS) 211 may emit a laser beam, e.g., an excimer laser beam. The laser oscillation structure 211 may emit the first laser beam L1 to the workpiece WP.

The first laser beam L1 may be irradiated onto the workpiece WP to heat the workpiece WP. The first laser beam L1 and a second laser beam L2 which is to be described below may be irradiated onto the loaded workpiece WP through the window 114.

The first laser beam L1 may have a first beam cross-section and a first wavelength. The first laser beam L1 may travel along a first optical path. In an implementation, the first beam cross-section may be, e.g., a quadrangle. In an implementation, the first beam cross-section may be rectangular. In an implementation, the first beam cross-section may be a square. In an implementation, the first beam cross-section may have a polygonal shape such as a triangle, a pentagon or an n-polygon, where n is equal to or greater than five, or an ellipse or a circle. Here, the first beam cross-section refers to a cross-section of the first laser beam L1 that is substantially perpendicular to a direction in which the first laser beam L1 proceeds. The definition of a second beam cross-section to be described below is also substantially the same.

The laser oscillation structure 211 may include a laser beam source that emits the first laser beam L1, a beam expansion telescope that is used to provide a first beam cross-section with a predetermined cross-sectional area, and a beam mask that is used to provide the first beam cross-section with a predetermined cross-sectional shape.

Referring to FIG. 8, the first reflective mirror M1 may be disposed on the first optical path. The first reflective mirror M1 may reflect the first laser beam L1. The first reflective mirror M1 may have a high reflectivity with respect to the first wavelength. The first reflective mirror M1 may transmit the second laser beam L2, which will be described below. For example, the first reflective mirror M1 may have a high transmittance with respect to a second wavelength to be described below. The first reflective mirror M1 may be, e.g., a dichromatic mirror.

In an implementation, the first reflective mirror M1 may transmit a portion of the first and second laser beams L1 and L2 and may transmit another portion of the first and second laser beams L1 and L2. Accordingly, the first reflective mirror M1 may correspond to a beam splitter that splits the first and second laser beams L1 and L2.

In an implementation, one first reflective mirror M1 may be provided, as illustrated in FIG. 8. In an implementation, depending on a configuration of an optical system, the first reflective mirror M1 may be omitted, or two or more first reflective mirrors M1 may be included.

In an implementation, the chamber 110 may be moved two-dimensionally on a plane that is in parallel with an upper surface of the workpiece WP so that the first laser beam L1 is irradiated onto the entire upper surface of the workpiece WP. In an implementation, the chamber 110 may be fixed, and the laser generator 130 except for the chamber 110 may be moved two-dimensionally on a plane that is in parallel with the upper surface of the workpiece WP.

The laser oscillator (LO) 221 may be configured to emit a second laser beam L2 having a second wavelength that is different from the first wavelength, to the workpiece WP. In an implementation, the second wavelength may be longer than the first wavelength.

The first band-stop filter 223 may be arranged on a second optical path which is a path of the second laser beam L2. The first band-stop filter 223 may block light of a first wavelength, but pass through light of a second wavelength. The laser oscillator 221 may emit not only light of the second wavelength but also light of the first wavelength.

The beam expansion telescope (BET) 225 may be arranged on the second optical path. The beam expansion telescope 225 may magnify the second laser beam L2. The beam expansion telescope 225 may magnify the second beam cross-section at a predetermined ratio. The second laser beam magnified by the beam expansion telescope 225 may reach the beam mask (MSK) 227.

Referring to FIG. 8, the second reflective mirror M2 may be arranged on the second optical path. The second reflective mirror M2 may have a high reflectivity with respect to the second laser beam L2.

A first beam splitter BS may be arranged on the second optical path. The first beam splitter BS1 may split the second laser beam L2. The first beam splitter BS1 may transmit a portion of the second laser beam L2, and reflect another portion of the second laser beam L2. The first beam splitter BS1 may be, e.g., a semi-transmissive reflective plate. In an implementation, the first beam splitter BS1 may transmit about 50% of the second laser beam L2, and reflect about 50% of the second laser beam L2. The second laser beam L2 reflected by the first beam splitter BS1 may be incident on the first power meter PM1. The second laser beam L2 that has transmitted through the first beam splitter BS1 may pass through the window 114 to be irradiated onto the workpiece WP. While the first reflective mirror M1 may be arranged on the second optical path directed to the workpiece WP, the first reflective mirror M1 may pass through the second laser beam L2.

The third laser beam L3 may be light generated as the second laser beam L2 is reflected by the workpiece WP. Referring to FIG. 8, the first reflective mirror M1 may be disposed on a third optical path which is an optical path of the third laser beam L3. However, like the second laser beam L2, the third laser beam L3 may transmit through the first reflective mirror M1.

The first beam splitter BS1 may split the third laser beam L3. The first beam splitter BS1 may transmit a portion of the third laser beam L3, and reflect another portion of the third laser beam L3. In an implementation, the first beam splitter BS1 may transmit about 50% of the third laser beam L3, and reflect about 50% of the third laser beam L3. The third laser beam L3 reflected by the first beam splitter BS1 may be incident on the second power meter PM2.

The second band-stop filter 233 may be arranged on the third optical path and spaced apart from the first optical path. The second band-stop filter 233 may be arranged on the third optical path between the first beam splitter BS1 and the second power meter PM2. The second band-stop filter 233 may block light of a first wavelength but pass through light of a second wavelength.

The first focusing lens 235 may be arranged on the third optical path and spaced apart from the first optical path. The first focusing lens 235 may be arranged on the third optical path between the first beam splitter BS1 and the second power meter PM2. The first focusing lens 235 may condense the third laser beam L3 by using the second power meter PM2.

The first power meter PM1 may measure energy of the second laser beam L2 reflected by the first beam splitter BS1. The first power meter PM1 may include, e.g., a photo-diode. The second power meter PM2 may measure energy of the third laser beam L3 reflected by the first beam splitter BS1. The second power meter PM2 may include, e.g., a photo-diode.

By way of summation and review, during contact bonding, misalignment of a semiconductor device due to contact with a solid block, tailing and particles due to an adhesive film, defects due to wrinkles of a release film could occur. A bonding method performed by injecting a high-temperature gas into a chamber or by providing a heat source such as a halogen lamp may be considered, and reducing warpage may be desirable.

The embodiments may provide a laser bonding apparatus, a method of bonding semiconductor devices, and a method of manufacturing a semiconductor package, by which drawbacks due to contact bonding may be compensated for and which are suitable for mass production to thereby allow low-cost manufacture of semiconductor products.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of bonding a plurality of semiconductor devices arranged on a main substrate of a workpiece, to the main substrate, the method comprising:
    loading the workpiece into a chamber having a transmissive window, the workpiece including the main substrate and the plurality of semiconductor devices arranged on the main substrate;
    increasing a pressure in the chamber and maintaining the increased pressure;
    increasing a temperature of the workpiece by irradiating a laser through the transmissive window; and
    lowering the pressure in the chamber.

2. The method as claimed in claim 1, wherein maintaining the increased pressure in the chamber includes maintaining a pressure of about 0.1 MPa to about 5 MPa relative to a pressure outside of the chamber.

3. The method as claimed in claim 1, wherein increasing the temperature of the workpiece includes simultaneously increasing the temperature of the plurality of semiconductor devices.

4. The method as claimed in claim 1, wherein increasing the temperature of the workpiece includes performing area heating on an area covering the plurality of semiconductor devices by using the laser.

5. The method as claimed in claim 1, wherein maintaining the increased pressure in the chamber includes supplying a pressurization gas to increase the pressure in the chamber, the pressurization gas including nitrogen ($N_2$), helium (He), neon (Ne), argon (Ar), carbon dioxide ($CO_2$), or a mixture thereof.

6. The method as claimed in claim 5, wherein the plurality of semiconductor devices is pressed towards the main substrate via the pressurization gas while increasing the temperature of the workpiece.

7. The method as claimed in claim 6, wherein pressing the plurality of semiconductor devices toward the main substrate is not performed with a solid block during the increasing of the temperature of the workpiece.

8. The method as claimed in claim 6, wherein the main substrate and the plurality of semiconductor devices are bonded to each other with a connection terminal therebetween while increasing the temperature of the workpiece.

9. The method as claimed in claim 8, further comprising filling an underfill in a space between the main substrate and the plurality of semiconductor devices after the main substrate and the plurality of semiconductor devices are bonded to each other while increasing the temperature of the workpiece.

10. The method as claimed in claim 1, wherein the workpiece further includes an adhesive between each of the plurality of semiconductor devices and the main substrate.

11. A method of manufacturing a semiconductor package, the method comprising:
    forming a workpiece having a main substrate on which a plurality of semiconductor devices are arranged;
    bonding the plurality of semiconductor devices to the main substrate;
    molding the plurality of semiconductor devices; and
    separating the plurality of semiconductor devices from each other,
    wherein bonding the plurality of semiconductor devices to the main substrate includes:
        loading the workpiece into a chamber having a transmissive window;
        increasing a pressure in the chamber and maintaining the increased pressure; and
        increasing a temperature of the workpiece by irradiating a laser through the transmissive window.

* * * * *